(12) United States Patent
Okayama et al.

(10) Patent No.: US 7,336,556 B2
(45) Date of Patent: Feb. 26, 2008

(54) MAGNETIC NON-VOLATILE MEMORY DEVICE

(75) Inventors: Katsumi Okayama, Kanagawa (JP); Kaoru Kobayashi, Chiba (JP); Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/519,895

(22) PCT Filed: Jul. 2, 2003

(86) PCT No.: PCT/JP03/08405

§ 371 (c)(1),
(2), (4) Date: Dec. 28, 2004

(87) PCT Pub. No.: WO2004/008536

PCT Pub. Date: Jan. 22, 2004

(65) Prior Publication Data

US 2005/0207263 A1    Sep. 22, 2005

(30) Foreign Application Priority Data

Jul. 11, 2002    (JP) .............................. 2002-202026

(51) Int. Cl.
*G11C 8/02* (2006.01)

(52) U.S. Cl. ..................... 365/232; 365/57; 307/91; 174/32; 257/421; 977/935

(58) Field of Classification Search ................ 365/232, 365/57; 174/32; 307/91; 257/421; 977/935
See application file for complete search history.

(56) References Cited

U.S. PATENT DOCUMENTS

| 5,880,910 | A | * | 3/1999 | Shouji et al. .......... 360/327.31 |
| 5,902,690 | A | | 5/1999 | Tracy et al. |
| 6,648,990 | B2 | * | 11/2003 | Yoshizawa .................. 148/313 |

(Continued)

FOREIGN PATENT DOCUMENTS

JP        11-176149        7/1999

(Continued)

*Primary Examiner*—Anh Phung
*Assistant Examiner*—Eric Wendler
(74) *Attorney, Agent, or Firm*—Robert J. Depke; Rockey, Depke & Lyons, LLC.

(57) ABSTRACT

A non-volatile magnetic memory device is proposed, which provides sufficient magnetic shielding performance for external magnetic fields. A first magnetic shield layer 60a and a second magnetic shield layer 60b, both made of a soft magnetic metal, are formed respectively on the bottom surface of the transistor section 20, which is the mounting side of the MRAM device 10, and on the top surface of the bit line 50, which is opposite to the bottom surface of the mounting side of the MRAM device 10. On the second magnetic shield layer 60a, a passivation film 70 is formed. The magnetic flux penetrated from the external magnetic field, is suppressed below the inversion strength of the MRAM device 10, thereby improving reliability. Moreover, by using soft magnetic metal as the magnetic shield layers 60a, 60b, the magnetic shield layers can be formed by the sputtering technique, particularly composing elements can be partly shared as elements of the targets to be used for forming various layers composing the MRAM device 10 by the sputtering technique, thereby enabling to form various layers of the MRAM device 10 in a single sputtering chamber efficiently.

19 Claims, 4 Drawing Sheets

U.S. PATENT DOCUMENTS

| | | | |
|---|---|---|---|
| 6,717,845 B2* | 4/2004 | Saito et al. | 365/173 |
| 6,943,993 B2* | 9/2005 | Chang et al. | 360/319 |
| 2001/0021089 A1* | 9/2001 | Miyauchi et al. | 360/324.2 |
| 2002/0003684 A1* | 1/2002 | Nakashio et al. | 360/324.2 |
| 2002/0050632 A1 | 5/2002 | Tuttle | |
| 2003/0099069 A1* | 5/2003 | Kagami et al. | 360/313 |

FOREIGN PATENT DOCUMENTS

| | | |
|---|---|---|
| JP | 11-238377 | 8/1999 |
| JP | 2002-158446 | 5/2002 |
| JP | 2002-158486 | 5/2002 |
| JP | 2003-115578 | 4/2003 |
| JP | 2003-249630 | 9/2003 |
| WO | WO 02/05286 | 1/2002 |

* cited by examiner

MAGNETIC NON-VOLATILE MEMORY DEVICE

This application claims priority to Japanese Patent Application Number JP2002-202026, filed Jul. 11, 2002 which is incorporated herein by reference.

FIELD OF THE INVENTION

The present invention relates to a magnetic non-volatile memory device, more specifically to the one provided with a magnetic shield structure for suppressing external magnetic field that may cause adverse effect on information stored therein.

BACKGROUND ART

Information communication equipment, especially compact personal equipment such as mobile terminals have become very popular and this raises a strong need for higher performances such as higher integration, higher speed, lower power consumption, etc. of memories, logic devices and the like to be used in such equipment. In particular, non-volatile memory devices are considered to be essential in the ubiquitous age. In case of power shortage or a trouble of the equipment, or even in case of interruption of the connection due to a trouble between the server and the network, the non-volatile memory devices are able to hold the stored information and thus protect important information.

Currently, flash memories using semiconductor, FRAMs (Ferro-electric Random Access Memories) using ferro-electric material and the like are widely used as such non-volatile memory devices. However, flash memories have a disadvantage in that the writing speed is in the order of microseconds and thus very slow. On the other hand, FRAMs can be rewritten in the range of $10^{12}$-$10^{14}$, thereby making them impossible to completely replacing SRAMs (Static Random Access Memories) or DRAMs (Dynamic Random Access Memories) because of durability. Moreover, difficulty in microminiature processing of FRAMs is pointed out.

Incidentally, more recent portable equipment are designed to maintain non-used circuit blocks in stand-by condition for reducing unnecessary power consumption as small as possible. However, if a non-volatile memory having both functions of a high speed work memory and a large capacity storage memory is achieved, it is possible to avoid waist of power and memories. It is also possible to realize so-called instant-on function in which the system can be started immediately after power-on if a high speed and large capacity non-volatile memories are available.

Non-volatile memories that may achieve the above objectives are attracting a great deal of attention and include, for example, a magnetic memory that is known as a MRAM (Magnetic Random Access Memory) (See Wang et. al., IEEE Trans. Magn. 33 (1997), 4498). The MRAM device is a semiconductor magnetic memory utilizing magneto resistance effect based on the spin dependent conduction phenomenon that is peculiar to a nano magnetic material and is a non-volatile memory capable of holding stored information without externally supplying power.

Information writing in the MRAM device is carried out by combined magnetic fields of bit lines and word lines wired in matrix for inverting the magnetic spin of the cell at the cross point of the bit line and the word line, thereby recording the orientations as the information "1" or "0". On the other hand, information reading is carried out using the TMR (Tunnel Magneto Resistance) effect to which the magneto resistance effect is applied. The TMR effect is the phenomenon in which the resistance changes depending on the orientation of the spin. In case of reading the MRAM device, the information "1" or "0" is read out depending on whether the resistance is high or low.

Additionally, since the MRAM device has a simple construction, it is easy to integrate. Also, since recording is made by rotating the magnetic moment, the number of rewritings can be very large. The access time is forecasted to be very high and is reported to be operable at 100 MHz (See R. Scheuerlein et. al., ISSCC Digest of Technical Papers, pp. 128-129, February 2000). As understood from the above, in conjunction with improved performance of the TMR materials in recent years, the MRAM devices are attracting a great deal of attention and there are increased hopes as high speed and large capacity non-volatile memories.

However, since the MRAM devices use a magnetic material for recording and holding the information, there is a possibility that the recorded information is erased or rewritten by the influence of external magnetic fields. Normally, the MRAM devices are mounted on a circuit board inside the electronic machine or equipment. Depending on kinds of electronic machine or equipment, as a progress of highly density mounting in recent years, mounted densely on a circuit board are various devices such as semiconductor devices, communication devices, miniature motors and the like other than the MRAM devices. Various mechanical components including an antenna, a power supply unit and the like are also installed inside the electronic machine or equipment to constitute a single apparatus together with the circuit board having the MRAM devices mounted thereon. This means that the MRAM devices are used in an environment of mixed magnetic fields over a wide frequency range including DC, low frequencies up to high frequencies. Accordingly, in order to put the MRAM devices into practical use, the MRAM devices need to be improved in resistance to external magnetic fields by means of improved mounting and/or magnetic shielding of the MRAM devices, thereby enhancing reliability of holding the recorded information in such devices.

As examples of magnetic shielding of such MRAM devices, U.S. Pat. Nos. 5,902,690 and 5,929,772 propose magnetic shielding structures for MRAM devices. In particular, U.S. Pat. No. 5,902,690 proposes to provide the MRAM device with a magnetic shielding characteristic by using insulation ferrite (MnZn and NiZn ferrites) layers that are soft magnetic metal oxides as a passivation film of the MRAM devices. On the other hand, U.S. Pat. No. 5,929,772 proposes to form a permalloy which is a magnetic member having a high magnetic permeability inside a package, thereby preventing magnetic flux from penetrating inside the device.

However, such conventionally proposed shield structure for MRAM devices is not yet perfect and has a possibility to cause a problem by permitting magnetic flux to penetrate into the MRAM devices and to erase the stored information or overwrite.

In order to prevent magnetic flux from penetrating, it is necessary and the most important to dispose a magnetic material having a high permeability about the device, thereby providing a magnetic path so that magnetic flux does not penetrate into the device. In this point of view, the conventional methods to form a ferrite passivation film or forming a permalloy inside the package provide an incomplete magnetic shield structure because the magnetic path is not completely closed.

Moreover, in case of using a ferrite layer as the passivation film that is made by a film forming by the sputtering technique, since the ferrite is an oxide magnetic material, it is most likely to cause oxygen loss, thereby making it very difficult to use a complete ferrite layer as the passivation film. On the other hand, if the ferrite layer is formed by any technique other than sputtering, there encountered other problems such as increased manufacturing steps and cost in addition to decreased production yield.

Furthermore, in case of disposing permalloys at both top and bottom locations within the package, it is possible to obtain better shielding performance than the ferrite passivation film. However, since there is no magnetic interconnection between the top and bottom permalloys, the magnetic path is not established. Although this technique is effective in high frequencies, a large effectiveness is not expected for low frequency magnetic fields that are common to the MRAM devices. Even if one of the top and bottom permalloys is jointed to a ground layer of the device using an electrically conductive adhesive, the above mentioned drawback of not establishing the magnetic path is still applicable, thereby not providing significant magnetic shielding.

The present invention is made in consideration of the above circumstances and it is an object of the present invention to provide a non-volatile magnetic memory device that provides sufficient magnetic shielding performance for external magnetic fields over a wide frequency range.

DISCLOSURE OF THE INVENTION

The present invention is an MRAM device provided with a magnetic shielding structure for suppressing the influence of external magnetic fields characterized in that a magnetic shield layer is made from a soft magnetic metal on the surface of the device for suppressing penetration of magnetic flux into the device.

According to the above construction, since the magnetic shield layer is formed on the surface of the MRAM device, penetration of magnetic flux into the MRAM device is suppressed. Furthermore, since a soft magnetic metal is used for forming the magnetic shield layer, it provides not only the magnetic shield layer of higher permeability as compared to one made from a soft magnetic metal oxide such as ferrite but also enabling to form the magnetic shield layer by the sputtering technique.

THE BEST MODE FOR CARRYIG OUT THE INVENTION

Now, embodiments of the present invention will be described hereunder by reference to the accompanying drawings.

Figure 1:
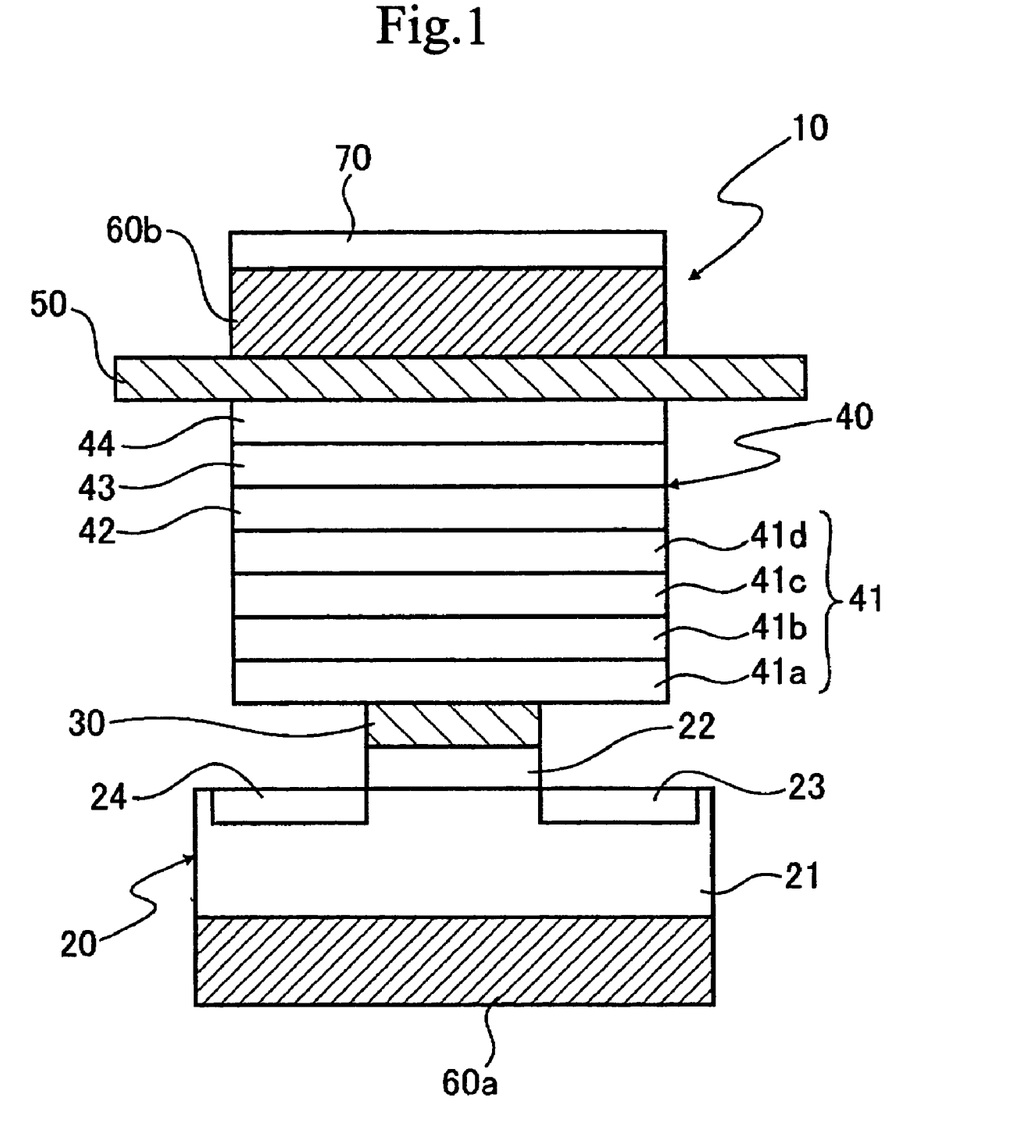
FIG. 1 is a simplified drawing to show an exemplified construction of the MRAM device provided with a magnetic shielding structure according to the present invention.

FIG. 1 is a simplified drawing of an exemplified MRAM device provided with the magnetic shield layer.

The MRAM device 10 is formed with a TMR section 40 for storing and holding information at a transistor section 20 which is formed for switching by way of a word line 30 made from aluminum or the like and a bit line 50 made from aluminum or the like is also formed on the TMR device section 40. Moreover, a first magnetic shield layer 60a and a second magnetic shield layer 60b are formed respectively on the bottom surface of the transistor section 20 and on the top surface of the bit line 50 for suppressing penetration of magnetic flux from external magnetic fields.

In order to protect the MRAM device 10, a passivation film 70 made from silicon nitride (SiN) or the like is formed on the second magnetic shield layer 60b which is formed on the bit line 50 defining a device surface opposite to the bottom surface of the transistor section 20 which is a device surface at the mounting side of the MRAM device 10.

The transistor section 20 of the MRAM device 10 comprises the gate 22 formed on a silicon substrate 21 and the source 23 and the drain 24 formed on the silicon substrate 21. The gate 22 of the transistor section 20 is connected to the word line 30 of the MRAM device 10.

The TMR device section 40 can be roughly divided into a fixed layer 41, an insulation layer 42, a recording layer 43 and a barrier layer 44. The fixed layer 41 of the TMR device section 41 comprises a sequential lamination of a PtMn layer 41a of 300 Å in film thickness, an FeCo layer 41b of 30 Å in film thickness, a Ru layer of 8 Å in film thickness, an FeCo layer 41d of 20 Å in film thickness. The insulation layer 42 is an $Al_2O_3$ layer of 15 Å in film thickness, the recording layer 43 is an FeCo layer of 30 Å in film thickness, the barrier layer 44 is a Ta layer of 50 Å in film thickness. Among these layers, the barrier layer 44 is connected to the bit line 50.

The first and second magnetic shield layers 60a, 60b are soft magnetic layers formed of a soft magnetic metal of the nano granular structure to achieve higher permeability or soft magnetic layers of a high permeability soft magnetic metal. The first magnetic shield layer 60a is formed on the bottom surface of the silicon substrate 21, while the second magnetic shield layer 60b is formed on the top surface of the bit line 50, Although not shown in the drawing, it is possible to provide a separate barrier layer of the same material as the second magnetic shield layer 60b between the second magnetic shield layer 60ba and the bit line 50. For example, if the second magnetic shield layer 60b is made from an electrically conductive material, an $Al_2O_3$ layer or the like may be formed as the barrier layer. This construction insulates between the second magnetic shield layer 60b and the bit line 50, thereby improving reliability of the MRAM device 10. In case of forming such barrier layer, appropriate materials are chosen by considering various characteristics and relationship of the second magnetic shield layer 60b, the bit line 50 and the barrier layer to be formed such as the coefficient of thermal expansion other than the electrical conductivity.

In case of magnetic flux of external magnetic fields attempting to penetrate into the MRAM device 10 of the above construction, such magnetic flux is most likely to penetrate into the first and the second magnetic shield layers 60a, 60b among elements constituting the MRAM device 10. This is because the first and the second magnetic shield layers 60a, 60b are made from soft magnetic material having high permeability, thereby enhancing the tendency of passing magnetic flux through them. Moreover, once magnetic flux penetrated into either one of the first and the second magnetic shield layers 60a, 60b, it tends to flow inside such magnetic shield layer. Subsequently, even if magnetic flux may get out of the magnetic shield layer, it tends to penetrate into another magnetic shield layer. In other words, in such MRAM device 10, a magnetic path is secured by the first and the second magnetic shield layers 60a, 60b. Accordingly, in the MRAM device 10, penetration of magnetic flux into the TMR device section 40 where information is recorded and held is effectively suppressed.

Now, a method of forming the magnetic shield layer of the MRAM device 10 as constructed hereinabove will be described.

The first and the second magnetic shield layers 60a, 60b of the nano granular structure may be formed in accordance with a regular nano granular forming technique. For example, a sputtering is carried out on the surface where the nano granular film is formed by using a $(Co_{0.92}Fe_{0.08})_{90}Al_{10}$ target, thereby forming an FeCo—Al—O nano granular film comprising a non-magnetic layer of $Al_2O_3$ at the grain boundary of an FeCo layer which is a magnetic layer (See Journal of Institute of Applied Magnetic of Japan No. 25, pp 871-874, 2001). Other than the above mentioned Fe—Al—O nano granular film, the nano granular film may be any nano granular film having a composition of Fe—Al—O, Co—Al—O or the like.

Also, the high permeability soft magnetic metal to be used for the first and the second magnetic shield layers 60a, 60b may be, for example, Fe, FeCo, FeSi, FeSiAl, FeAl or NiFe. Even in case of forming the nano granular film using such materials, it is possible to film form by the sputtering technique as is the case of forming the nano granular film.

In case of making the MRAM device 10 provided with the first and the second magnetic shield layers 60a, 60b which are formed in the manner as described hereinabove, for example, the transistor section 20 is first formed on a wafer constituting the silicon substrate 21 through a normal processing before being placed in a sputtering chamber. Subsequently, the word line 30, many layers comprising the TMR device section 40 and the bit line 50 are sequentially film formed in lamination by the sputtering technique. The first magnetic shield layer 60a and the second magnetic shield layer 60b are formed respectively on the bottom surface of the transistor section 20 and on the top surface of the bit line 50 by the sputtering technique using the target which has been described hereinabove as an example.

After forming the second magnetic shield layer 60b, a passivation film 70 is formed thereon. Subsequently, necessary processes such as making holes in the passivation film 70 and the second magnetic shield layer 60b for forming pads on the passivation film 70 are carried out before dicing, thereby forming discrete MRAM devices 10 each covered with the passivation film 70 on the top surface.

Other than the above example, the MRAM device 10 may be made, for example, by forming the first magnetic shield layer 60a on the bottom surface of the silicon substrate 21 prior to forming the TMR device section 40. Then, it is placed in a sputtering chamber to form only the second magnetic shield layer 60b after forming the bit line 50. In this case, the first magnetic shield layer 60a which is formed in advance can be formed by any film forming technique other than the sputtering.

Moreover, the MRAM device 10 may be formed, for example, by placing a semi-completed product having the transistor section 20, the word line 30, the respective layers constituting the TMR device section 40 and the bit line 50 through appropriate processing, thereby forming the first and the second magnetic shield layers 60a, 60b by the sputtering technique. It is to be noted in this case that the first magnetic shield layer 60a may be formed in advance by any technique other than the sputtering and forming only the second magnetic shield layer 60b by the sputtering technique.

As shown in the above examples, in fabricating the MRAM device 10, the first and the second magnetic shield layers 60a, 60b may be formed by the sputtering technique. And what is important herein is that the composing elements of the targets which are used in forming the soft magnetic layers constituting the first and the second magnetic shield layers 60a, 60b are common to a part of the elements of the target to be used for forming various layers of the MRAM device 10.

In other words, targets such as Fe, Co, Pt, Mn, Al and the like for forming the TMR device section 40 and the targets for forming the first and the second magnetic shield layers 60a, 60b may be provided in a single sputtering chamber, thereby enabling to form the various layers in a common chamber. This means that any possibility of introducing impurities that may adversely affect the storage and holding characteristic of the MRAM device 10 can be suppressed at the time of forming the MRAM device 10 having the first and the second magnetic shield layers 60a, 60b. Additionally, it helps to cut production cost and improves production yield.

It is to be noted that the first and the second magnetic shield layers 60a, 60b may be made by various conventional film forming techniques such as a plating technique, a spin coating technique or the like other than the above mentioned sputtering technique. Moreover, an aerosol deposition (AD) technique in which fine particles of raw materials composing of a film are made in aerosol and are bombarded onto an object on which the film is formed can be used for forming the first and the second magnetic shield layers 60a, 60b because it is useful for easily forming a thick film at a high speed.

Furthermore, as described hereinabove, it is possible to form the first and the second magnetic shield layers 60a, 60b by using different film forming techniques from each other. For example, the first magnetic shield layer 60a is film formed on the bottom surface of the silicon substrate 21 by the spin coat technique, while the second magnetic shield layer 60b is film formed on the top surface of the bit line 50 by the sputtering technique. At the time of choosing each film forming technique, it is necessary to consider productivity of the MRAM device 10, film thickness of the magnetic shield layer to be formed and the like.

Now, the magnetic shielding characteristic by the magnetic shield layer will be described.

An evaluation of the magnetic shielding characteristic is made on the magnetic shield layer made from a soft magnetic layer of the nano granular structure with the composition of Fe—Al—O. The Fe—Al—O nano granular film is formed by firstly sputtering Fe and Al and then making the sputtering chamber an oxidation atmosphere to allow natural oxidation. It is to be noted at the time of characteristic evaluation that measurements of saturation magnetization and anisotropic magnetic field are made by film forming Fe—Al—O on separate substrates while applying a magnetic field.

The saturated magnetization of the formed nano granular film was 1.1T, the coercive force was 2.3 A/m and anisotropic magnetic field was 6 kA/m. Permeability was $\mu'=200$ and $\mu''=20$ (both at 100 MHz) and tendency was seen that loss becomes higher at high frequency.

Additionally, MRAM devices having the magnetic shield layers and MRAM devices having no magnetic shield layers are fabricated. External magnetic fields are applied to these MRAM devices to measure strength of magnetic field inside the MRAM device. Measurements were made by externally applying 200 Oe magnetic field onto the MRAM devices having the magnetic shield layer up to 200 nm.

Figure 2:
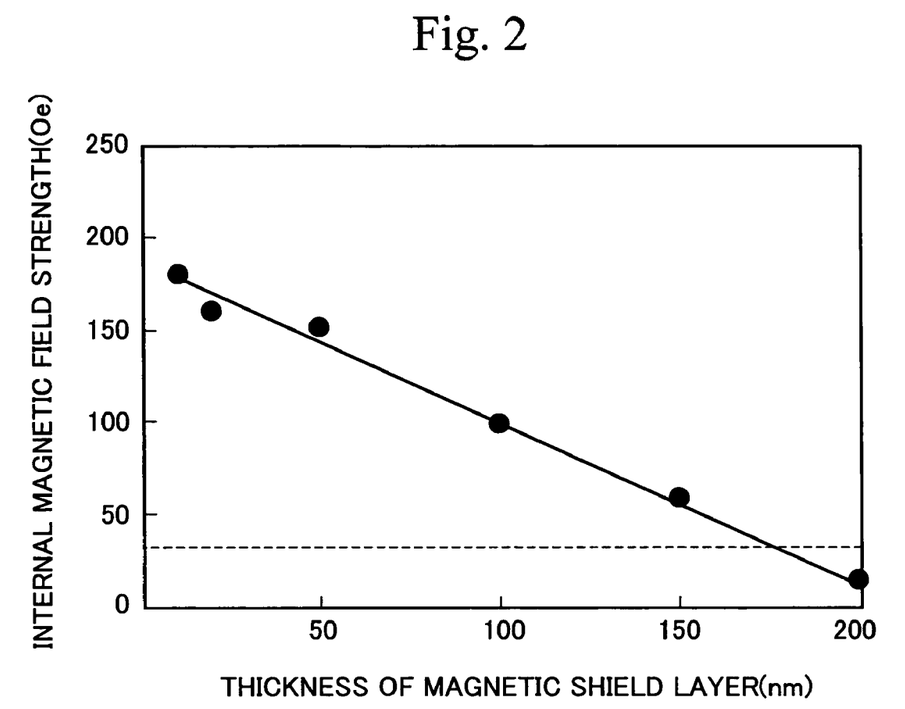
FIG. 2 is a graph to show the relationship between the film thickness of the magnetic shield layer and the strength of the internal magnetic field.

FIG. 2 is a graph to show the relationship between the film thickness of the magnetic shield layer of the MRAM device and the strength of magnetic field inside the device. In FIG. 2, the horizontal axis represents the film thickness (nm) of the magnetic shield layer, while the vertical axis represent the strength of magnetic field (Oe) inside the device.

As shown in FIG. 2, strength of the internal magnetic field due to application of 200 Oe external magnetic field onto the MRAM device decreases as the film thickness of the magnetic shield layer increases. In general, the inverting magnetic field of the MRAM device is about 30 Oe. Judging from the result as shown in FIG. 2, the magnetic shield layer is required to be as thick as about 170 nm in order to reduce the external magnetic field less than the above value. However, since the optimum film thickness of the magnetic shield layer depends on the magnetic environment at the location where the MRAM device is disposed and the material of the magnetic shield layer, the measurement results do not mean that all MRAM devices should have the film thickness equal to about 170 nm. The relationship in FIG. 2 shows that the internal magnetic field can be adjusted by varying the film thickness of the magnetic shield layer. It is therefore possible that the film thickness can be set in response to the magnetic environment of the MRAM device.

As described hereinabove, in consideration of problems associated with conventional technique such as difficulties in both fabrication facilities and performance of forming the ferrite layer after formation of the MRAM device using a single sputtering chamber and relatively low permeability of the ferrite layer as compared with a soft magnetic metal even if it is formed, the present invention features in forming a magnetic shield layer using soft magnetic metal.

The magnetic shield layer of soft magnetic metal may be formed to have the nano granular structure or may be made from soft magnetic metal having high permeability. Since soft magnetic layers are chosen to have partly common composing elements to elements of the targets to be used for forming various layers of the MRAM device, a common sputtering chamber that is used for forming the layers of the MRAM device can be used for forming the soft magnetic layer. Accordingly, the MRAM device provided with magnetic shield layers can be fabricated efficiently and the fabrication steps can be suppressed to the minimum, thereby reducing the fabrication cost.

The MRAM device provided with the magnetic shield layers as formed in the above manner is able to suppress the magnetic flux penetrating from the external magnetic fields down to a level below the inverting magnetic field strength of the recording layer, improve storage and hold stability and enable to be used under sever magnetic field environment.

Figure 3:
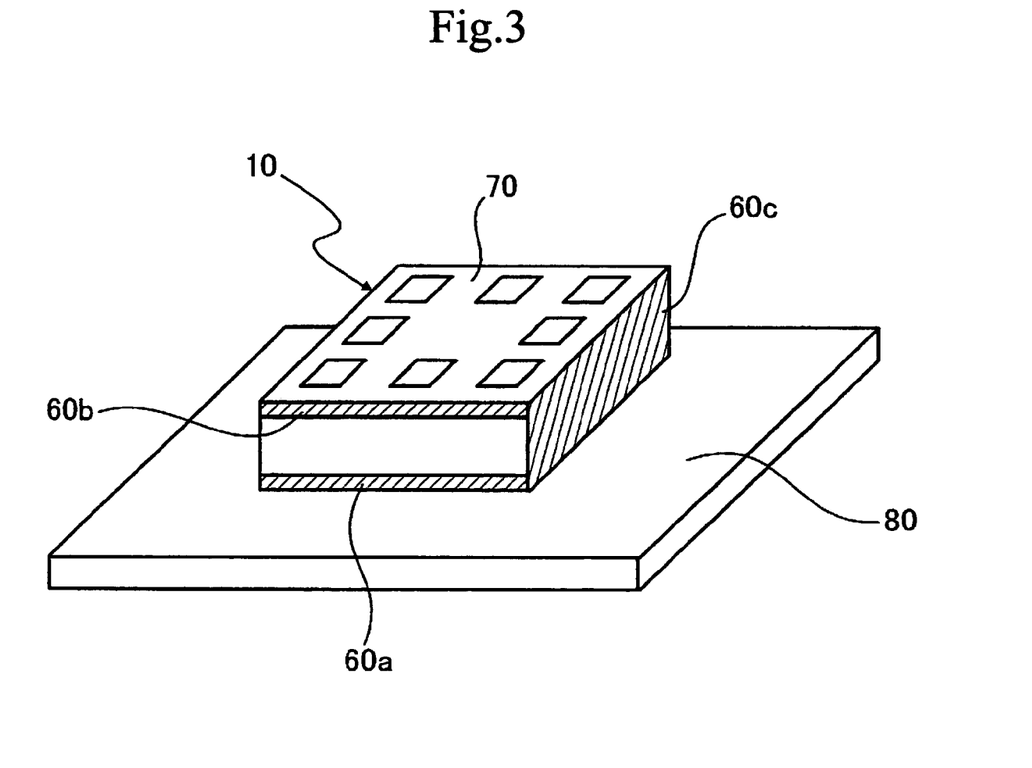
FIG. 3 is a simplified drawing of the exemplified MRAM device for magnetically coupling the magnetic shield layer.

Moreover, the aforementioned MRAM device 10 may be designed to have a construction in which both of the first and the second magnetic shield layers 60a, 60b formed on the bottom and top surfaces of the MRAM device 10 are magnetically coupled together. FIG. 3 is a simplified drawing to show an exemplified construction of the MRAM device in which the magnetic shield layers are coupled together. It is to be noted in FIG. 3 that constituent elements equivalent to those in FIG. 1 use the same reference numerals and their detailed descriptions are omitted.

The MRAM device 10 is provided with the first and the second magnetic shield layers 60a, 60b on the top and the bottom surfaces thereof, respectively. The MRAM device 10 is mounted on a lead frame 80 at the side of the first magnetic shield layer 60a and is provided with the passivation film 70 on the second magnetic shield layer 60b. The MRAM device 10 is also formed with a third magnetic shield layer 60c on the side surface. The third magnetic shield layer 60c is designed to magnetically couple the first and the second magnetic shield layers 60a, 60b.

In the MRAM device 10 provided with such magnetic shielding structure, a magnetic path is formed through the first, the second and the third magnetic shield layers 60a, 60b and 60c. Accordingly, magnetic flux from external magnetic fields do not penetrate inside the MRAM device 10, rather conducted to the first, the second and the third magnetic shield layers 60a, 60b and 60c, thereby suppressing penetration into the device. Furthermore, the magnetic flux once entered into either one of the first, the second and the third magnetic shield layers 60a, 60b and 60c tends to be prevented from leaking out of the end of such magnetic shield layer or tends to flow into adjacent magnetic shield layer, thereby effectively shielding the MRAM device 10 from the external magnetic fields.

The third magnetic shield layer 60c is formed with a soft magnetic layer in the same manner as the first and the second magnetic shield layers 60a, 60b. A sputtering technique, a plating technique, a spin coat technique, an AD technique or the like may be used for forming the third magnetic shield layer 60c. The choice of the techniques for forming the third magnetic shield layer 60c is made in consideration of the construction and productivity of the device on which the third magnetic shield layer 60c is to be formed, film thickness of the third magnetic shield layer 60c to be formed, or the like.

It is to be noted that the third magnetic shield layer 60c may be formed on one side surface of the MRAM device 10 as shown in FIG. 3. However, the magnetic shield layer is preferably formed so as to cover the entire circumference of the MRAM device 10 for assured suppression of penetration of the magnetic flux.

Figure 4:
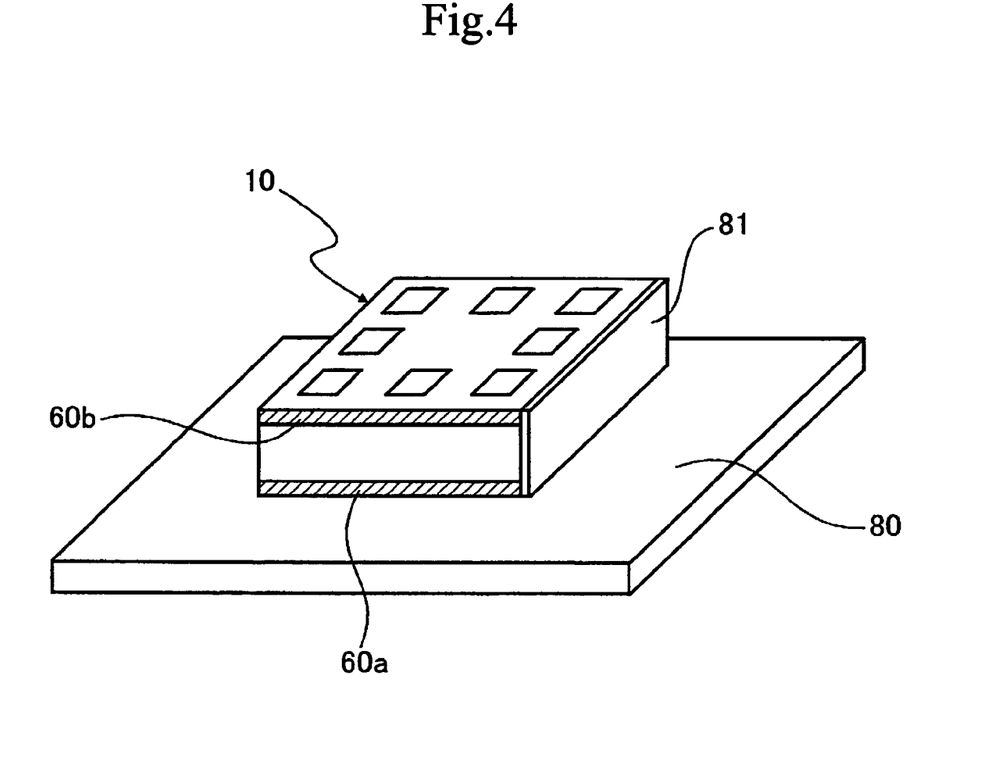
FIG. 4 is a simplified drawing of another example of the MRAM device for magnetically coupling the magnetic shield layer.

It is also possible that the lead frame 80 has integral protrusions of soft magnetic member or protrusions each covered with soft magnetic material on the surface thereof for locating the MRAM device 10 thereat. FIG. 4 is a simplified drawing to show another exemplified construction of the MRAM device in which the magnetic shield layers are magnetically coupled together. However, it is to be noted that the constituting elements equivalent to those in FIG. 3 have the same reference numerals and their detailed descriptions are omitted herein.

As shown in FIG. 4, the MRAM device 10 provided with the first and the second magnetic shield layers 60a, 60b is mounted on the lead frame 80 having an integral protrusion 81 made from a soft magnetic material or covered with a soft magnetic material on the surface thereof. The protrusion 81 is formed to extend in the vertical direction with respect to the lead frame 80 in such a manner to be located on the side surface of the MRAM device 10 that is mounted on the lead frame 80. When mounting the MRAM device 10 on the lead frame 80, end portions of the first and the second magnetic shield layers 60a, 60b are made in contact with the protrusion 81 or are in the close proximity to it.

It is to be understood that such protrusion 81 is able to provide the similar advantages to the third magnetic shield layer 60c as shown in FIG. 3 and effectively provides magnetic shielding of the MRAM device 10 from external magnetic fields. It is also possible to surely suppress penetration of magnetic flux if the protrusion 81 is formed so as to enclose the MRAM device 10.

Although the first and the second magnetic shield layers defining the soft magnetic layers are formed at the two locations, i.e., on the device mounting surface and the opposite surface of the MRAM device 10 in the above description, it is of course possible to form on only the device mounting surface or the opposite surface to the device mounting surface in order to obtain a certain magnetic shielding of magnetic fields in a given frequency range.

As described hereinabove, according to the present invention, the magnetic shield layer is formed on the surface of the MRAM device by using soft magnetic metal. By this construction, penetration of magnetic flux inside the MRAM device is suppressed. Accordingly, even if external magnetic fields are applied, the magnetic flux penetrated into the recording layer is suppressed below the inversion strength of magnetic field of the recording layer, thereby improving stability of the storage and hold of the information and realizing MRAM devices which can be used under severe magnetic field environment.

Moreover, by using soft magnetic metal as the magnetic shield layer, the magnetic shield layer can be formed by the sputtering technique, particularly composing elements can be partly shared as elements of the targets to be used for forming various layers composing the MRAM device by the sputtering technique, thereby enabling to form various layers of the MRAM device in a single sputtering chamber. As a result, the MRAM device can be fabricated efficiently and can reduce the production cost.

The invention claimed is:

1. A magnetic non-volatile memory device provided with a magnetic shielding structure for suppressing the influence of external magnetic fields,
    wherein said magnetic non-volatile memory comprises a tunnel-magneto-resistance element, a word line, a bit line, and a selection transistor, the selection transistor being formed at least partially in a silicon substrate,
    wherein a first magnetic shield layer made from a soft magnetic metal is formed over the silicon substrate and a second magnetic shield layer made from a soft magnetic metal is formed over the bit line of the magnetic non-volatile memory, and
    wherein said device includes a plurality of layers between the magnetic shield layers, at least one of said plurality of layers and at least one of said magnetic shield layers being comprised of a same material.

2. The magnetic non-volatile memory device according to claim 1, wherein:
    each of said first and second magnetic shield layers is formed of a nano granular structure having a magnetic layer and a non-magnetic layer.

3. The magnetic non-volatile memory device according to claim 1, wherein:
    said same material includes one selected from the group consisting of Fe, Co, Pt, Mn, and Al.

4. The magnetic non-volatile memory device according to claim 1, wherein said second magnetic shield layer is formed on the bit line, and said first magnetic shield layer is formed on a surface of the silicon substrate opposite the surface of the silicon substrate in which the selection transistor is formed.

5. The magnetic non-volatile memory device according to claim 1, further comprising a third magnetic shield layer formed on a side surface of the magnetic non-volatile memory such that the third shield layer interfaces with at least a portion of both the first and the second magnetic shield layers and such that all three shield layers are magnetically coupled.

6. The magnetic non-volatile memory device according to claim 1, wherein said bit line is electrically connected to said tunnel-magneto-resistance element.

7. The magnetic non-volatile memory device according to claim 1, further comprising an electrical insulating barrier layer formed between the bit line and the second magnetic shield layer.

8. A method for manufacturing a magnetic non-volatile memory device provided with a magnetic shielding structure for suppressing the influence of external magnetic fields, said method comprising the steps of:
    providing said magnetic non-volatile memory comprising a tunnel-magneto-resistance element, a word line, a bit line, and a selection transistor, the selection transistor being formed at least partially in a silicon substrate,
    providing a first magnetic shield layer made from a soft magnetic metal over the silicon substrate and a second magnetic shield layer made from a soft magnetic metal over the bit line of the magnetic non-volatile memory, and
    wherein a single target is used for forming at least one of the shield layers and a layer of said magnetic non-volatile memory located between the magnetic shield layers.

9. The method for manufacturing a magnetic non-volatile memory device according to claim 8, wherein said second magnetic shield layer is provided on the bit line, and said first magnetic shield layer is provided on a surface of the silicon substrate opposite the surface of the silicon substrate in which the selection transistor is formed.

10. The method for manufacturing a magnetic non-volatile memory device according to claim 8, further comprising a step of providing a third magnetic shield layer formed on a side surface of the magnetic non-volatile memory such that the third shield layer interfaces with at least a portion of both the first and the second magnetic shield layers and such that all three shield layers are magnetically coupled.

11. The method for manufacturing a magnetic non-volatile memory device according to claim 8, wherein said bit line is electrically connected to said tunnel-magneto-resistance element.

12. The method for manufacturing a magnetic non-volatile memory device according to claim 8, further comprising the step of providing an electrical insulating barrier layer between the bit line and the second magnetic shield layer.

13. An array of magnetic non-volatile memory devices, each provided with a magnetic shielding structure for suppressing the influence of external magnetic fields,
    wherein each of said magnetic non-volatile memory devices comprises a tunnel-magneto-resistance element, a word line, a bit line, and a selection transistor, the selection transistor being formed at least partially in a silicon substrate,
    wherein a first magnetic shield layer made from a soft magnetic metal is formed over the silicon substrate of each of the magnetic non-volatile memory devices and a second magnetic shield layer made from a soft magnetic metal is formed over the bit line of each of the magnetic non-volatile memo devices, and
    wherein at least one of said magnetic shield layers extends across substantially the entire array of memory devices.

14. The magnetic non-volatile memory device as defined in claim 13, wherein at least one of said first and second magnetic shield layers is formed of a nano-granular structure having a magnetic and a non-magnetic layer.

15. The array of magnetic non-volatile memory devices according to claim 13, wherein said second magnetic shield layer is formed on the bit line of each of the magnetic non-volatile memory devices, and said first magnetic shield layer is formed on a surface of the silicon substrate of each of the magnetic non-volatile memory devices opposite the surface of the silicon substrate in which the selection transistor is formed.

16. The array of magnetic non-volatile memory devices according to claim 13, further wherein a third magnetic shield layer is formed on a side surface of each of the magnetic non-volatile memory devices such that the third shield layer interfaces with at least a portion of both the first and the second magnetic shield layers of each of the respective magnetic non-volatile memory devices and such that all three shield layers are magnetically coupled.

17. The array of magnetic non-volatile memory devices according to claim 13, wherein said bit line of each respective magnetic non-volatile memory device is electrically connected to the tunnel-magneto-resistance element of the same respective magnetic non-volatile memory device.

18. The array of magnetic non-volatile memory devices according to claim 13, wherein each respective magnetic non-volatile memory device includes an electrical insulating barrier layer formed between the bit line and the second magnetic shield layer.

19. A wafer substrate comprising:
 a plurality of information storage sections attached to a substrate, each said information storage section including a plurality of layers;
 a first magnetic shield layer for suppressing the influence of external magnetic fields, said first magnetic shield layer formed across substantially the entire wafer substrate; and
 a second magnetic shield layer for suppressing the influence of external magnetic fields, said second magnetic shield layer formed at a side of said plurality of information storage sections opposite said wafer substrate;
 wherein each of said information storage sections comprises a tunnel-magneto-resistance element, a word line, a bit line, and a selection transistor, the selection transistor being formed at least partially in the wafer substrate,
 wherein the first magnetic shield layer is formed over the substrate of each of the information storage sections in which the selection transistor is at least partially formed, and the second magnetic shield layer is formed over the bit line of each of the information storage sections,
 wherein at least one of said plurality of layers of said information storage sections and at least one of said magnetic shield layers are comprised of a same material.

* * * * *